(12) United States Patent
Spirkl

(10) Patent No.: US 7,489,153 B2
(45) Date of Patent: Feb. 10, 2009

(54) SEMICONDUCTOR MEMORY DEVICE

(75) Inventor: Wolfgang Spirkl, Germering (DE)

(73) Assignee: Infineon Technologies AG, Munich (DE)

( * ) Notice: Subject to any disclaimer, the term of this patent is extended or adjusted under 35 U.S.C. 154(b) by 211 days.

(21) Appl. No.: 11/159,026

(22) Filed: Jun. 22, 2005

(65) Prior Publication Data
US 2006/0002226 A1 Jan. 5, 2006

(30) Foreign Application Priority Data
Jun. 22, 2004 (DE) .................. 10 2004 030 053

(51) Int. Cl.
  *G01R 31/26* (2006.01)
  *G01R 31/02* (2006.01)
(52) U.S. Cl. .................. 324/765; 324/763
(58) Field of Classification Search ......... 324/763–765; 714/733–734; 364/201
See application file for complete search history.

(56) References Cited

U.S. PATENT DOCUMENTS

| | | | |
|---|---|---|---|
| 3,982,190 A * | 9/1976 | Schaefer ................ 327/2 |
| 5,095,267 A * | 3/1992 | Merrill et al. .............. 324/763 |
| 6,166,607 A * | 12/2000 | Schoellkopf ............... 331/57 |
| 6,426,641 B1 * | 7/2002 | Koch et al. ................ 324/765 |
| 2002/0125903 A1 * | 9/2002 | Lovett ...................... 324/765 |
| 2003/0030461 A1 * | 2/2003 | Oberle et al. ............. 324/765 |
| 2007/0001697 A1 * | 1/2007 | Dobberpuhl et al. ........ 324/763 |

FOREIGN PATENT DOCUMENTS

EP    0 953 987 A2    11/1999

OTHER PUBLICATIONS

German Patent Office Examination Report dated Feb. 10, 2005.

* cited by examiner

*Primary Examiner*—Ha Tran T Nguyen
*Assistant Examiner*—Joshua Benitez
(74) *Attorney, Agent, or Firm*—Patterson & Sheridan, L.L.P.

(57) ABSTRACT

The invention relates to a semiconductor memory device, which can be operated in a normal operating mode and a test mode, comprising: data terminals and data clock terminals; input receivers for processing the signal arriving via the respective terminal, a respective input receiver being assigned to a data terminal and/or data clock terminal; at least one test circuit, a respective test circuit being assigned to an input receiver and the test circuit being designed for determining at least one predetermined property of the assigned input receiver.

17 Claims, 2 Drawing Sheets

SEMICONDUCTOR MEMORY DEVICE

CROSS-REFERENCE TO RELATED APPLICATIONS

This application claims foreign priority benefits under 35 U.S.C. §119 to co-pending German patent application number DE 10 2004 030 053.4, filed 22 Jun. 2004. This related patent application is herein incorporated by reference in its entirety.

BACKGROUND OF THE INVENTION

1. Field of the Invention

The invention relates to a semiconductor memory device.

2. Description of the Related Art

A semiconductor memory device in accordance with the prior art will be described with reference to FIG. 2. FIG. 2 shows a schematic partial view of a packaged semiconductor memory device.

An incoming data signal DQ is transferred via a pin 1 on the package to the pad 2 of the semiconductor memory device 3. An input receiver 4 provided on the semiconductor memory device 3 amplifies the incoming signal and outputs this to a flip-flop 5. A similar construction is provided for the data clock signals DQS in the semiconductor memory device 3. In this case, the output signal of the input receiver 4 for the data clock signal DQS serves as a clock signal for the flip-flop 5. The internal data signal DQint output by the flip-flop 5 is processed further in the semiconductor memory device 3.

Testing such a semiconductor memory device typically involves, inter alia, also checking the accuracy of the interface timing, and in particular the so-called setup time and hold time. When a semiconductor memory device is operated or tested at high frequency, e.g. with a clock frequency of more than 500 MHz, however, it becomes increasingly more difficult to check the accuracy of the interface timing since it is necessary to use test devices which can generate such high clock frequencies with a high accuracy and can also measure frequencies with a high accuracy.

Consequently, what is needed is a semiconductor memory device which enables simpler and more cost-effective testing of the semiconductor memory device in particular at high clock frequencies.

SUMMARY OF THE INVENTION

The invention provides a semiconductor memory device, which can be operated in a normal operating mode and a test mode, comprising data terminals and data clock terminals, input receivers for processing/conditioning or receiving and/or amplifying the signal arriving via the respective terminal, essentially a respective input receiver being assigned preferably essentially one-to-one to a data terminal and/or data clock terminal, and at least one test circuit, the respective test circuit being assigned preferably one-to-one to an input receiver and the test circuit being designed for determining or measuring at least one predetermined property of the assigned input receiver, in particular the absolute delay of the signal propagation time that is brought about by the input receiver.

In one embodiment, the measurement is preferably carried out by the test circuit if the semiconductor memory device is in the test mode. The test mode is, in particular, an operating mode of the semiconductor memory device which involves checking for error-free functioning of the semiconductor memory device prior to delivery of the semiconductor memory device. This involves checking in particular whether e.g. the signal propagation times or signal delays in the semiconductor memory device are within a predetermined range.

In one embodiment, the test circuit is arranged in particular locally at the respective assigned input receiver. Furthermore, the test circuit is preferably small or has a small spatial extent.

In one embodiment, the test circuit or test circuits provided can be used to measure or ascertain in particular the absolute delay of the signal propagation time that is brought about by the input receiver. The measurement is preferably carried out separately for each input receiver. The measured values ascertained for the absolute delay of a data terminal and of an associated data clock terminal can be compared with one another or with a predeterminable reference value and it is possible to ascertain whether the difference in the delays is within a predeterminable range.

Preferably, in the test mode a ring oscillator is formed in each case by a test circuit and the associated input receiver. The input receiver forms that part of the ring oscillator which predominates for the frequency or the oscillation period of the ring oscillator, i.e. essentially the part which determines the frequency or the oscillation period of the ring oscillator.

In one embodiment, the measurement of the predetermined property of the associated input receiver involves ascertaining the predetermined property by the frequency or oscillation frequency and/or the oscillation period of the ring oscillator being measured or compared with a predetermined reference frequency and/or reference period duration. The absolute delay of the signal propagation time that is brought about by the input receiver can subsequently be ascertained with the aid of the measured frequency or the oscillation period.

In one embodiment, the input receivers in each case comprise at least one first input, a second input and an output and it is possible, in particular in the test mode, to establish signal connection of the output of the input receiver to the first input and/or the second input. In this case, the output signal is fed back in such a way that the signal is inverted once or an odd number of times in the ring oscillator.

In one embodiment, the input receivers may be designed as so-called "single ended" input receivers. In this case, the first input is preferably configured as a so-called signal input, and the second input as a so-called reference input. In the normal operating mode, a signal to be evaluated or processed in the input receiver is received via the signal input and a reference signal, with which the signal received via the signal input is compared, is received via the reference input.

The input receiver may be configured in such a way that the output signal of the input receiver is fed back either to the signal input or to the reference input in the test mode. A reference signal is applied to the input to which the output signal is not fed back.

In another embodiment, the input receivers may be designed as so-called "differential" input receivers. In this case, the input receiver comprises an inverting signal input and a noninverting signal input. In the normal operating mode, a signal is applied to the noninverting signal input and the inverse of said signal is applied to the inverting signal input.

For the test mode, it may be provided that the output signal is fed back either to the noninverting signal input, the inverting signal input or both inputs.

Preferably, the semiconductor memory device furthermore comprises at least one measurement terminal and a signal corresponding to the frequency or the oscillation period of the ring oscillator can be read out at the measurement terminal.

In one embodiment, a signal corresponding to the frequency or the oscillation period of the ring oscillator may be read out at the measurement terminal preferably with the aid of a conventional measuring or test device. According to another embodiment, it may be provided that a binary signal specifying whether the ascertained frequency of the ring oscillator lies below a predeterminable reference frequency or whether the ascertained oscillation period lies above a predeterminable oscillation period duration can be read out via the measurement terminal. In one embodiment, a pin or terminal that is not required during the test may be used as the measurement terminal.

In another embodiment, it may be provided that one measurement terminal is signal-connected to a plurality of ring oscillators and the measurement of the frequency or the oscillation period of the respective ring oscillator is carried out successively. In another embodiment, it may be provided that a respective measurement terminal is assigned essentially one-to-one to a ring oscillator.

In one embodiment, the semiconductor memory device furthermore comprises at least one frequency divider, which is provided between the ring oscillator and the measurement terminal, for the purpose of reducing the frequency of the ring oscillator.

Providing the frequency divider may make it possible to reduce the frequency of the ring oscillator, so that the frequency output at the measurement terminal is lower. Consequently, in one embodiment, it not necessary to provide an external test device that can measure very high-frequency signals. Consequently, it is possible to use a conventional test device.

In one embodiment, the frequency divider further preferably comprises local frequency divider units that are in each case assigned to a test circuit, for the purpose of reducing the frequency output by the test circuit, and at least one global frequency divider unit, to which a plurality of local frequency divider units are in signal connection, for the purpose of reducing the frequency reduced by the local frequency divider units.

In one embodiment, the local frequency divider units are in each case assigned one-to-one to a test circuit and arranged spatially in proximity to the respective test circuit. Furthermore, the local frequency divider units preferably have a small spatial extent. The at least one global frequency divider unit may have a larger spatial extent than the local frequency divider units and enable a greater reduction of the frequency. In one embodiment, it may be provided that the local frequency divider units firstly reduce the frequency of the frequency signal of the ring oscillator only slightly, e.g. carry out a frequency division by the factor 2 or 4, and the global frequency divider unit subsequently carries out a greater reduction of the frequency, e.g. by the factor 1024.

In one embodiment, the ring oscillator comprises a voltage divider.

In particular, the voltage divider is provided in a signal path connecting the output of the input receiver to a second input of the input receiver.

Preferably, the voltage divider comprises at least two resistors and the ratio of the resistances of the resistors is dependent on the value of the signal divided by the voltage divider. The voltage divider is thus preferably a dynamic voltage divider whose resistance ratio varies in a manner dependent on the output signal of the input receiver.

In one embodiment, the ring oscillator comprises a buffer.

The buffer is provided, in particular, in order to decouple the signal output by the input receiver from the normal signal path, i.e. the signal path in the normal operating mode, and/or to amplify it sufficiently so that the circuit oscillates. In one embodiment, the buffer may be provided as an inverting buffer if this is required by the condition for the oscillation of the oscillator. In one embodiment, the oscillation of the ring oscillator requires, in particular, the output signal of the input receiver to be inverted once or an odd number of times. The buffer is preferably provided between the output of the input receiver and the voltage divider in the signal path.

The test circuit preferably comprises at least one switching device, by means of which the semiconductor memory device can be brought into the test mode.

The switching device is preferably a switch by means of which a signal path can be closed. A switching device is preferably provided in the signal path between the output of the input receiver and the second input of the input receiver. This is in particular the signal path in which the buffer and the part of the voltage divider are provided. Furthermore, in one embodiment, a second switching device, which is provided between a pad or contact of the semiconductor memory device to which a predeterminable, essentially constant voltage potential can be applied and a first input of the input receiver. As a result, the signal present at the first input of the input receiver can be set to the predefined voltage potential.

In one embodiment, a respective test circuit is provided for essentially each data terminal and data clock terminal.

It is possible to measure or ascertain the predetermined property, including the absolute signal delay for the respective input receiver of a data terminal and a data clock terminal.

In one embodiment, the ring oscillator is configured in particular as follows:

In the test mode, a predetermined reference voltage is present at the first input of the input receiver. In one embodiment, this may be achieved in particular by applying the predetermined reference voltage to the pin that is signal-connected to the first input in the normal operating mode. In another embodiment, the first input of the input receiver may be connected via a switch to a pin of the semiconductor memory device at which a predetermined reference voltage is present. The output of the input receiver is signal-connected to the second input of the input receiver via a buffer, a resistor, which forms a part of a voltage divider, and a switch. The predetermined reference voltage is likewise signal-connected to the second input of the input receiver via a further resistor, which forms a further part of the voltage divider. Consequently, the voltage output at the output of the input receiver, in the test mode, is amplified by the buffer and, if necessary, inverted and correspondingly divided with the aid of the voltage divider. The voltage present at the second input of the input receiver is thus dependent on the signal present at the output of the input receiver and the ratio of the resistors of the voltage divider.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Testing semiconductor memory devices involves, inter alia, testing whether the so-called interface timing of data signals and data clock signals is within predetermined limits. In particular, the so-called setup time $t_S$ and the so-called hold time $t_H$ are tested. In this case, the setup time $t_S$ is that time period before an edge of a data clock signal in which a data signal which is intended to be read in or out with the edge must have a predetermined value. In this case, the hold time $t_H$ is that time period after an edge of a data clock signal in which a data signal which is intended to be read in or out with the edge must have a predetermined value.

In some cases, the setup time $t_S$ and the hold time $t_H$ assume very low values particularly in high-frequency operation of the semiconductor memory device at e.g. 500 MHz.

Furthermore, the temporal ratio of the data signal and the associated data clock signal is of great importance. If, by way of example, the setup time $t_S$ and the hold time $t_H$ of the externally applied signals are within the predetermined limits but the data clock signal is shifted temporally to an excessively great extent with respect to the associated data signal on the chip or the semiconductor memory device, errors can nevertheless occur.

In considerations that led to the present invention, it was found that the input amplifiers of the data signals and data clock signals have a great influence the temporal delay of the respective signal. For example, the difference between the temporal delay brought about by an input amplifier of a data signal and the temporal delay brought about by an input amplifier of an associated data clock signal ought not to exceed a predetermined value if an error-free functioning of the semiconductor memory device is to be ensured.

In accordance with a preferred embodiment of the present invention, a circuit or circuits are provided which are part of the semiconductor memory device and by means of which the absolute temporal delay of a signal that is brought about by the assigned input amplifier can be ascertained or measured. In particular, a frequency signal corresponding to the temporal delay is generated with the aid of the circuit described below.

Figure 1:
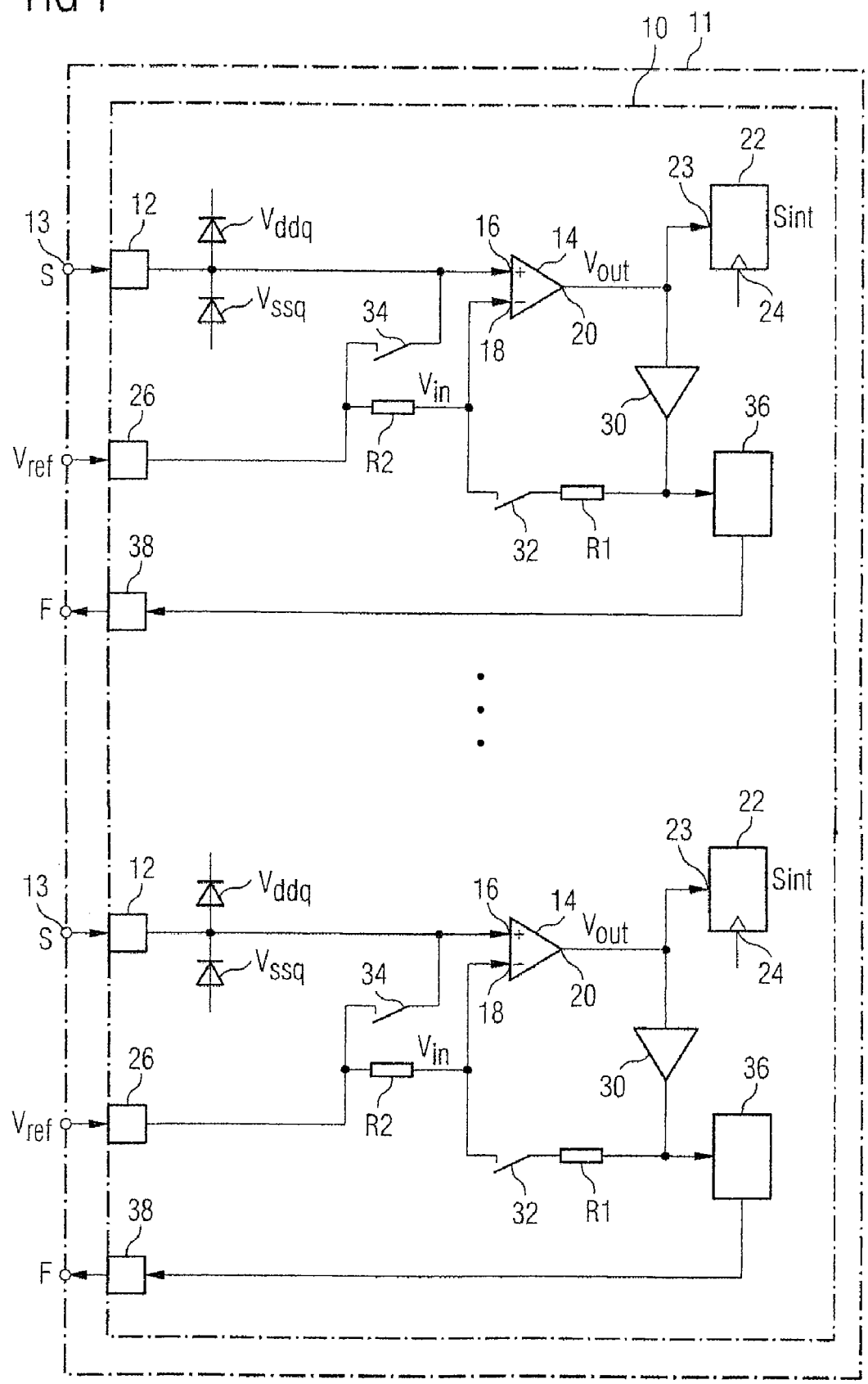
FIG. 1 shows a schematic partial view of a semiconductor memory device in accordance with a preferred embodiment of the present invention.
Figure 2:
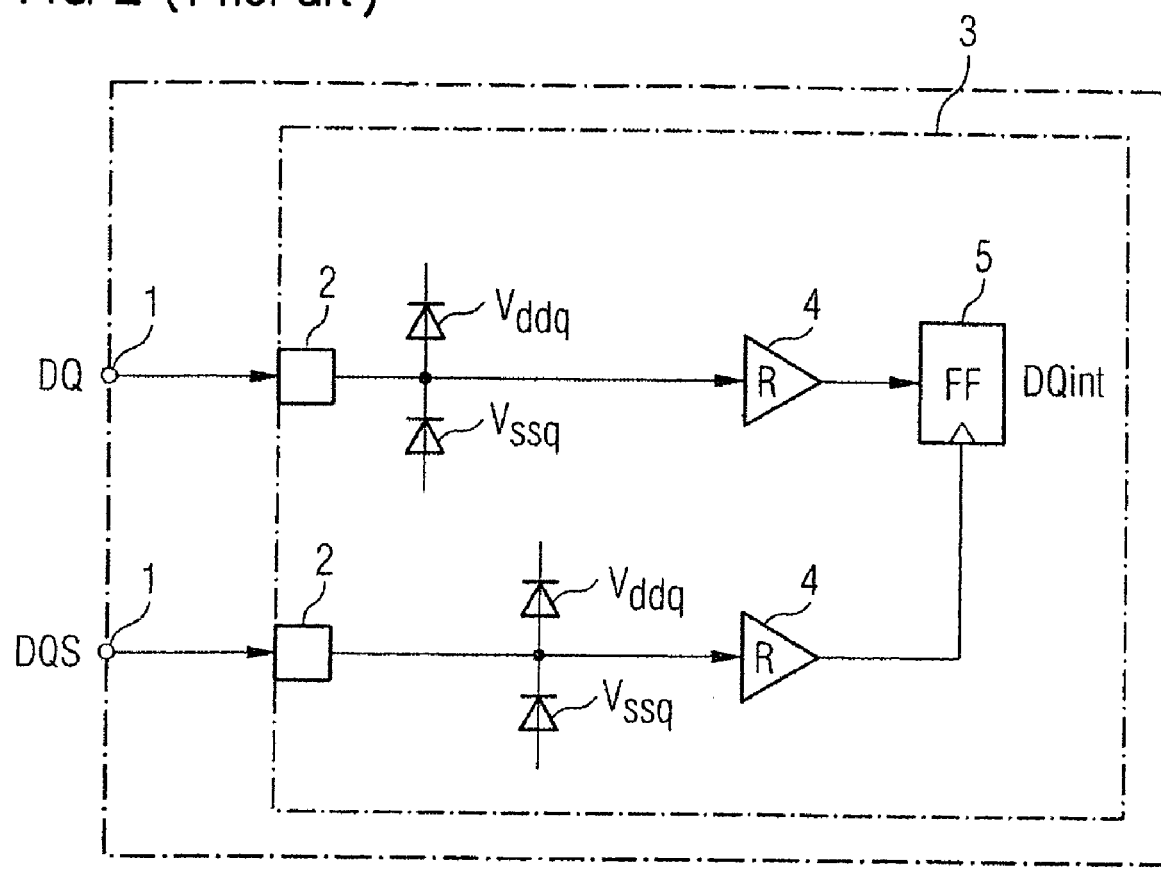
FIG. 2 shows a schematic partial view of a semiconductor memory device in accordance with the prior art.

FIG. 1 shows a schematic partial view of a semiconductor memory device in accordance with a preferred embodiment of the present invention.

The semiconductor memory device 10 comprises a multiplicity of data pads and assigned data clock pads. During operation of the semiconductor memory device 10, data signals DQ are transferred via data pads and data clock signals DQS are transferred via data clock pads.

For the sake of clarity, only data pad 12 is shown in the embodiment illustrated. Since the internal circuit construction is the same for essentially all the data pads or data clock pads, a description is given below only for the internal circuit associated with a data pad 12. For this reason, reference is made below only to signals S, with no distinction being made as to whether data or data clock signals are concerned. The internal circuit described below is preferably provided for essentially each data pad and data clock pad in each case.

In the embodiment illustrated in FIG. 1, the semiconductor memory device 10 is packaged, i.e. connected to a printed circuit board device or an interposer 11. In particular, the pads of the semiconductor memory device 10 are signal-connected to pins 13 provided from the interposer 11. Via the pins 13, the semiconductor memory device 10 can be contact-connected to an external circuit.

The internal circuit comprises an input receiver 14. The input receiver illustrated is configured as a so-called "single ended" input receiver. The input receiver 14 comprises a first input or signal input 16 and a second input or reference input 18. The first input 16 is signal-connected to the pad 12. The second input 18 is connected via a resistor $R_2$ to a pad 26, to which a predetermined reference voltage $V_{ref}$ is applied during the operation of the semiconductor memory device 10.

The output 20 of the input amplifier 14 is signal-connected to a flip-flop 22. If the input amplifier 14 is assigned to a data pad, the output 20 is connected to a data input 23 of the flip-flop 22. If the input amplifier 14 is assigned to a data clock pad, the output 20 is connected to a clock input 24 of the flip-flop 22.

The semiconductor memory device 10 is furthermore provided with a test circuit 101 assigned in each case to an internal circuit of a pad 12. The test circuit comprises, in particular, a buffer 30, a voltage divider formed by the resistors R1 and R2 and two switches 32 and 34. In this case, in addition to the circuitry interconnection described above, the output 20 of the input receiver 14 is signal-connected to the second input 18 of the input receiver 14 via the buffer 30, the resistor R1 and the switch 32. Furthermore, the pad 26, at which the reference voltage $V_{ref}$ is present during operation, can be signal-connected to the first input 16 and the input receiver 14 via the switch 34.

The semiconductor memory device has two operating modes—a normal operating mode and a test mode—, which are described below.

During the normal operating mode, the switches 32 and 34 are open, so that no signal connection is formed between the output 20 and the second input 18 of the input receiver 14 and the pad 26 and the first input 16 of the input receiver 14.

The signal that is present at a first input 16 of the input receiver 14 that has been received via the pad 12 is compared with a predeterminable signal or voltage value present at the second input 18 of the input receiver 14. In accordance with the comparison result, a corresponding output signal $V_{out}$ is output at the output 20 of the input receiver 14.

The signal output at the output 20 is fed to the flip-flop 22. With the aid of the associated data clock signal that is fed to the flip-flop 22 at the input 24 thereof, the signal is forwarded, in accordance with the clocking of the signal present at the input 24, as signal Sint to the internals of the semiconductor memory device 10 and processed further there.

In the test mode of the semiconductor memory device 10, the switches 32 and 34 are closed. As a result, a ring oscillator is formed by the input receiver 14, the buffer 30 and the resistor R1. In this case, the input receiver 14 is the essentially predominant part of the ring oscillator, i.e. that part of the ring oscillator which determines the frequency or the oscillation period of the ring oscillator.

The operation of the semiconductor memory device 10 in the test mode is described below.

If the switch 34 is closed, the predetermined voltage $V_{ref}$ is present in constant fashion at the first input 16 of the input receiver 14.

Between the second input 18 and the first input 16 of the input receiver 14 there is a voltage difference present that is determined by the difference between the reference voltage $V_{ref}$ and the inverse of the output voltage $V_{out}$ of the input receiver 14 that is present at the output 20 of the input receiver 14, this difference voltage being divided by the voltage divider formed by the resistors $R_1$ and $R_2$. In particular, the voltage difference $V_{in}-V_{ref}$ present between the second input 18 and the first input 16 of the input receiver 14 may be determined by means of the following formula:

$$V_{in} - V_{ref} = \frac{R_2}{R_1 + R_2}(V_{out} - V_{ref}) \qquad \text{(Equation 1)}$$

The ring oscillator thus formed may oscillates with a predetermined frequency, the frequency essentially being determined by the properties of the input receiver 14.

The temporal delay brought about by the respective input receiver 14 can be ascertained with the aid of the frequency or the oscillation period of the ring oscillator.

In one embodiment, the first input 16 of the input receiver 14 is not connected via the switch 34 to the reference voltage. According to another embodiment, (not illustrated), in the test mode the reference voltage $V_{ref}$ may be transferred to the first input 16 directly via the pad 12.

Furthermore, the semiconductor memory device 10 is provided with a frequency divider 36 as part of the test circuit used in the test mode. The frequency divider 36 preferably branches off from the signal path of the ring oscillator, to be precise between the buffer 30 and the resistor $R_1$. Consequently, the incoming signal into the frequency divider 36 is the inverse of the output signal $V_{out}$ of the input receiver 14.

The frequency divider is furthermore signal-connected to a measurement pad or measurement terminal 38. Via the measurement pad 38, the signal output by the frequency divider 36 is output or can be read out from the semiconductor memory device 10. The frequency divider 36 is provided in order to reduce the frequency of the ring oscillator by a predeterminable factor. The signal present at the measurement pad 38 is thus of lower frequency and can be measured more simply. In particular, it is not necessary to provide test or measuring devices that can measure very high-frequency signals with a high precision. Conventional test devices can thus preferably be used.

In an alternative embodiment, which is not illustrated, it may be provided that the frequency divider 36 is formed in two parts. In this case, a respective local frequency divider unit is provided which is formed in proximity to the ring oscillator and is preferably assigned one-to-one thereto. Furthermore, a global frequency divider unit is provided, which is assigned to a plurality of local frequency divider units. The local frequency divider unit preferably essentially has small dimensions and carries out a first division of the frequency of the ring oscillator. The factor by which the frequency changes is relatively low in this case.

The global frequency divider unit subsequently carries out a larger frequency division. The fact that a plurality of local frequency divider units are assigned to a global frequency divider unit means that it is thus possible to reduce the space required for the magnitude of the frequency division.

In particular, it may be provided that the local frequency divider units firstly reduce the frequency of the frequency signal of the ring oscillator only slightly, e.g. carry out a frequency division by the factor 2 or 4, and the global frequency divider unit subsequently carries out a greater reduction of the frequency, e.g. by the factor 1024.

The embodiment described above has described an arrangement in which the oscillation of the ring oscillator is achieved by inversion of the output signal $V_{out}$ by feedback of the output signal to the second input or reference input 18, which is the inverting input of the input receiver. In this case, the buffer 30 is provided as a noninverting buffer. By way of example, two inverting buffers may be connected in series for this purpose.

In another embodiment, it may be provided that in the test mode the output signal is fed back to the first input or signal input 16, which is the noninverting input of the input receiver. In this case, the buffer 30 has an inverting function.

In one embodiment, it may be provided that the signal fed back by the input receiver 14 is the inverse output signal $-V_{out}$. In such a case, the buffer 30 has an inverting function if the output signal is fed back to the second input 18. If the output signal is fed back to the first input 16, a noninverting buffer is provided.

In a further embodiment (not illustrated), the input receiver may be configured as a differential input receiver. In this case, the input receiver comprises an inverting signal input S− and a noninverting signal input S+. In the normal operating mode, a signal is applied to the noninverting signal input S+ and the inverse of said signal is applied to the inverting signal input S−. If the input receiver is used for a clock signal, differential clock signals T+ and T− are involved in this case.

For the test mode, it may be provided that the output signal is fed back either to the noninverting signal input S+, the inverting signal input S− or both inputs.

If the output signal is fed back to the noninverting signal input S+ or the inverting signal input S−, a reference signal is applied to the respective other signal input. In this embodiment, it may be provided, in accordance with the embodiment described above, that either the output signal or the inverse thereof is fed back.

As an alternative, it may be provided that the output signal is fed back to both signal inputs. In this case, preferably, the output signal is fed back to the noninverting signal input S+ and the inverse of the output signal is fed back to the inverting signal input S−.

In all of the embodiments described above, the feedback of the output signal is configured in such a way that the signal is inverted once or an odd number of times in the signal path of the ring oscillator. Furthermore, the signal path of the ring oscillator in the test mode is decoupled from the signal path in the normal operating mode with the aid of a buffer.

By measuring the frequency or oscillation period of the ring oscillator, it is possible to ascertain the absolute signal delay brought about by the input receiver 14. In particular, there is a direct relation between the frequency or oscillation period of the ring oscillator and the signal delay of the input receiver.

Preferably, a test circuit described above is provided for the input receivers of essentially all the data pads and data clock pads. Consequently, the signal delay of essentially all the input receivers can be measured. In order to determine the accuracy of the interface timing, i.e. the accuracy of the timing between a data signal and the associated data clock signal, the delay of the respective data input receiver and of the associated data clock input receiver is measured. The difference in the two values ascertained is subsequently ascertained. If the difference in the delays is outside a predeterminable range, the accuracy of the interface timing is insufficient.

In particular, the circuit described above can be used to ascertain whether the values for the setup time and the hold time are in a predeterminable range.

According to another embodiment of the invention, provision may be made for comparing the read-out frequency on the chip with an external reference frequency that is fed into the semiconductor memory device. The output signal is now a binary signal specifying whether or not the frequency of the ring oscillator is below the predeterminable reference frequency. The read-out of the measurement result can thereby be simplified further.

The fact that the test circuit is arranged locally at the input receiver to be measured means that the measurement accuracy can be increased.

According to another embodiment, the circuit described above can be used to carry out a test over the entire permissible operating range of the semiconductor memory device 10. In particular, the reference frequency $V_{ref}$ or the temperature may be altered. As a result, it is possible to ascertain the operating behavior of the semiconductor memory device 10 and in particular of the input receivers 14 for altered operating parameters.

Input receivers furthermore often have a so-called "DC offset". The DC offset is, in particular, that difference voltage between the inputs 16 and 18 of the input receiver 14 for which the output signal $V_{out}$ assumes a value between the logic "0" and "1", i.e. that difference voltage for which the output signal $V_{out}$ changes from the logic "0" to the logic "1".

In one embodiment, the test circuit described above can furthermore be used to measure the DC offset of an input receiver 14. In this case, it may be provided, in particular, that the resistors R1 and R2 of the voltage divider are designed to be variable and can be varied in accordance with the output signal $V_{out}$ of the input receiver 14. By way of example, a signal corresponding to a "0" or "low" signal can be fed back weakly, i.e. the ratio R1 to R2 assumes a small value, and a signal corresponding to a logic "1" or a "high" signal can be fed back strongly, i.e. the ratio R1 to R2 assumes a large value. A measurement of the DC offset can be achieved, in particular, by approximating the difference in the voltage present at the two inputs 16 and 18 to the DC offset. In particular, the DC offset is reached when the input receiver no longer switches.

According to one embodiment, the asymmetry can be determined or it is possible to determine whether an asymmetry is present. An asymmetry is present in particular when the duration of the "low" signal or of the logic "0" $T_L$ of a period duration T of the output signal $V_{out}$ differs from the duration of the "high" signal or of the logic "1" $T_H$ of a period duration T of the output signal $V_{out}$ where T is equal to $T_L+T_H$. In some cases, it was found that an input amplifier switches more slowly, and so the frequency of the output signal decreases or the period duration of the output signal increases, the smaller the voltage or potential difference between the inputs of the input amplifier. To determine whether an asymmetry is present, both the low signal and the high signal are fed back weakly to the input of the input amplifier, i.e. the ratio of the resistors $R_1$ and $R_2$ of the voltage divider is chosen in such a way that the voltage difference present between the inputs of the input receiver is small. In this case, both signals are fed back with an attenuation by the same factor. The switching speed of the input amplifier decreases as a consequence. If an asymmetry is present, the switching speed and thus the frequency of the output signal decrease to a very great extent or the oscillation period increases to a great extent. Consequently, the frequency or the period duration of the output signal can be used to make a statement about whether an asymmetry is present.

According to another embodiment, it is possible to measure the delay for the two output signals low and high or the duration of the "low" signal $T_L$ of a period duration T of the output signal $V_{out}$ and the duration of the "high" signal $T_H$ of the period duration T separately to an approximation. For this purpose, the signal, low or high, whose duration is intended to be measured is fed back weakly. The other signal is fed back strongly, i.e. the ratio of the resistors of the voltage divider is chosen in such a way that the voltage difference present between the inputs of the input receiver is high. As a consequence, the input amplifier switches rapidly if the signal fed back strongly is present at an input of the input amplifier, and the input amplifier switches slowly if the signal fed back weakly is present at an input of the input amplifier. The frequency of the output signal can be expressed by the following formula:

$$F_{out} = \frac{1}{T_L + T_H} \quad \text{(Equation 2)}$$

If, by way of example, the low signal is fed back very strongly and the high signal very weakly, $T_L \ll T_H$. The frequency of the output signal is determined here to a very great extent by the duration of the high signal fed back weakly. In particular, the duration of the low signal fed back strongly is negligible for the determination of frequency to an approximation. Consequently, to an approximation, the frequency of the output signal is inversely proportional to the duration of the high signal fed back weakly. Consequently, the duration of the high signal can be determined to an approximation by means of the following formula:

$$T_H = \frac{1}{F_{out}} \quad \text{(Equation 3)}$$

The duration of the low signal can be determined in a corresponding manner by the high signal being fed back strongly and the low signal being fed back weakly.

The procedure described above thus makes it possible to carry out a clock ratio measurement of the output signal of the input amplifier.

While the foregoing is directed to embodiments of the present invention, other and further embodiments of the invention may be devised without departing from the basic scope thereof, and the scope thereof is determined by the claims that follow.

What is claimed is:

1. A semiconductor device, comprising:
   a plurality of receiver circuits for receiving a data signal presented on a data pin when the device is in a normal operating mode, wherein each receiver circuit comprises an input receiver;
   a plurality of test circuits including the receiver circuits, wherein only one separate test circuit is assigned to each of the receiver circuits, wherein each test circuit further includes a buffer, wherein each test circuit is configured to couple a respective one of its buffers with a respective one of its input receivers to form a respective ring oscillator in a test mode, wherein a frequency of an oscillating signal generated from the respective ring oscillator is determined by the input receiver of the receiver circuit to which the test circuit is assigned; and
   a measurement pin for reading out a measurement signal indicative of the frequency of a respective oscillating signal.

2. The semiconductor device of claim 1, wherein the frequency of the oscillating signal is indicative of a propagation delay of a respective receiver circuit.

3. The semiconductor device of claim 1, further comprising:

one or more data pins for receiving the data signal; and a pin for receiving a reference voltage to be applied to an input of a respective test circuit.

4. The semiconductor device of claim 3, wherein the pin for receiving the reference voltage is one of the data pins.

5. The semiconductor device of claim 1, wherein the plurality of test circuits each comprise a comparator circuit configured to generate a binary measurement signal indicative of the frequency of the respective oscillating signal relative to a reference frequency.

6. A semiconductor device, comprising:

a data pin;

a plurality of receiver circuits for receiving a data signal presented on the data pin when the device is in a normal operating mode, wherein each receiver circuit comprises an input receiver;

a plurality of test circuits including the receiver circuits, wherein only one separate test circuit is assigned to each of the receiver circuits, wherein each test circuit further includes a buffer, wherein each test circuit is configured to couple a respective one of its buffers with a respective one of its input receivers to form a respective ring oscillator in a test mode, wherein a reference voltage is applied to an input of each of the test circuits when the device is in the test mode, and wherein a frequency of an oscillating signal generated from the respective ring oscillator is determined by the input receiver of the receiver circuit to which the test circuit is assigned; and a measurement pin for reading out a measurement signal indicative of the frequency of a respective oscillating signal.

7. The semiconductor device of claim 6, wherein the plurality of test circuits each comprise a voltage divider that divides the reference voltage to generate a voltage signal applied to an inverting input of a receiver circuit.

8. The semiconductor device of claim 7, wherein a ratio of resistances of the voltage divider is variable based on an output voltage of the respective receiver circuit.

9. A semiconductor device, comprising:

a data pin;

a plurality of receiver circuits for receiving a data signal presented on the data pin when the device is in a normal operating mode, wherein each receiver circuit comprises an input receiver;

a plurality of test circuits including the receiver circuits, wherein only one separate test circuit is assigned to each of the receiver circuits, wherein each test circuit further includes a buffer, wherein each test circuit is configured to couple a respective one of its buffers with a respective one of its input receivers to form a respective ring oscillator in a test mode, wherein a frequency of an oscillating signal generated from the respective ring oscillator is determined by the input receiver of the receiver circuit to which the test circuit is assigned;

a frequency divider circuit that generates a measurement signal indicative of the frequency of a respective oscillating signal by dividing a frequency of the respective oscillating signal by a predetermined factor; and a measurement pin for reading out the measurement signal.

10. A method for testing a plurality of receiver circuits of a memory device, comprising:

placing the device in a test mode, thereby causing a plurality of test circuits, including the receiver circuits as components, to form a respective ring oscillator for each of the plurality of test circuits, wherein only one separate test circuit is assigned to each of the receiver circuits, wherein each test circuit further includes a buffer, wherein each test circuit is configured to couple a respective one of its buffers with a respective one of its input receivers to form the respective ring oscillator in the test mode, wherein a frequency of an oscillating signal generated from the respective ring oscillator is determined by the input receiver of the receiver circuit to which the test circuit is assigned; and monitoring a measurement signal provided on a pin of the memory device to determine the property of each of the receiver circuits, wherein the measurement signal is indicative of the frequency of a respective oscillating signal.

11. The method of claim 10, wherein monitoring the measurement signal comprises monitoring the measurement signal to determine when the measurement signal stops oscillating.

12. The method of claim 10, wherein monitoring the measurement signal comprises monitoring the measurement signal to determine an asymmetry of the oscillating signal based on a frequency of the measurement signal.

13. The method of claim 10, wherein monitoring the measurement signal comprises monitoring the measurement signal to determine one of a duration of a low output signal of a respective receiver circuit and a duration for a high output signal.

14. The method of claim 10, further comprising providing a reference voltage on an external pin of the memory device, wherein the reference voltage is used by the plurality of test circuits to generate the oscillating signal.

15. A semiconductor device, comprising:

a plurality of receiver circuits, wherein each receiver circuit comprises an input receiver;

test means for generating an oscillating signal, wherein the test means comprises only one separate test circuit for each of the plurality of receiver circuits, wherein each test circuit further includes a buffer, wherein each test circuit is configured to couple a respective one of its buffers with a respective one of its input receivers to form a respective ring oscillator in a test mode, wherein a frequency of the oscillating signal generated from the respective ring oscillator is determined by the input receiver of a respective receiver circuit; and readout means for monitoring a measurement signal indicative of the frequency of a respective oscillating signal.

16. The semiconductor device of claim 15, wherein the test means comprises a single test circuit for the plurality of the one or more receiver circuits.

17. The semiconductor device of claim 15, wherein the readout means comprises an external pin of the memory device.

* * * * *